United States Patent
Watanabe et al.

(10) Patent No.: US 11,162,182 B2
(45) Date of Patent: Nov. 2, 2021

(54) TIN OR TIN ALLOY PLATING SOLUTION

(71) Applicant: MITSUBISHI MATERIALS CORPORATION, Tokyo (JP)

(72) Inventors: Mami Watanabe, Naka (JP); Kyoka Susuki, Naka (JP); Kiyotaka Nakaya, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/757,855

(22) PCT Filed: Oct. 23, 2018

(86) PCT No.: PCT/JP2018/039332
§ 371 (c)(1),
(2) Date: Apr. 21, 2020

(87) PCT Pub. No.: WO2019/082884
PCT Pub. Date: May 2, 2019

(65) Prior Publication Data
US 2020/0378024 A1 Dec. 3, 2020

(30) Foreign Application Priority Data

Oct. 24, 2017 (JP) ............................... JP2017-205203
Oct. 19, 2018 (JP) ............................... JP2018-197082

(51) Int. Cl.
*C25D 3/32* (2006.01)
*C25D 7/00* (2006.01)
*H05K 3/18* (2006.01)

(52) U.S. Cl.
CPC .............. *C25D 3/32* (2013.01); *C25D 7/00* (2013.01); *H05K 3/181* (2013.01); *H05K 3/188* (2013.01); *H05K 2203/0338* (2013.01)

(58) Field of Classification Search
CPC ................................... C25D 3/30; C25D 3/32
See application file for complete search history.

(56) References Cited

U.S. PATENT DOCUMENTS

| | | | |
|---|---|---|---|
| 2002/0187355 A1 | 12/2002 | Crosby | |
| 2015/0122661 A1* | 5/2015 | Woertink | C25D 3/32 205/253 |
| 2015/0267310 A1* | 9/2015 | Ikumoto | H05K 3/4007 205/125 |

FOREIGN PATENT DOCUMENTS

| | | | | |
|---|---|---|---|---|
| EP | 2868778 A2 | 5/2015 | | |
| JP | 11269691 | * 10/1999 | ............... | C25D 3/46 |

(Continued)

OTHER PUBLICATIONS

English translation of JP2008028336, Haruhara et al., Feb. 7, 2008. (Year: 2008).*

(Continued)

*Primary Examiner* — Stefanie S Wittenberg
(74) *Attorney, Agent, or Firm* — Locke Lord LLP; James E. Armstrong, IV; Nicholas J. DiCeglie, Jr.

(57) ABSTRACT

A tin or tin alloy plating solution includes: (A) a soluble salt containing at least a stannous salt; (B) an acid selected from an organic acid and an inorganic acid or a salt thereof; (C) a phenyl-based surfactant formed of polyoxyethylene bisphenol ether represented by the General Formula (1); and (D) a leveling agent, (1)

(Continued)

(a)

(b)

(c)

(d)

here, in the Formula (1), X is $C_aH_{2a}$ (a is 1 or 3) and m is 2 to 12.

5 Claims, 1 Drawing Sheet

(56) References Cited

FOREIGN PATENT DOCUMENTS

| JP | 200026991 | * | 1/2000 | ............... C25D 3/32 |
|----|-----------|---|--------|---------------------------|
| JP | 2001-089894 A | | 4/2001 | |
| JP | 2001262391 | * | 9/2001 | ............... C25D 3/60 |
| JP | 2003-082493 A | | 3/2003 | |
| JP | 2006144073 | * | 6/2006 | ............... C25D 3/60 |
| JP | 2008-028336 A | | 2/2008 | |
| JP | 4249292 | * | 4/2009 | ............... C25D 3/32 |
| JP | 2014-125662 A | | 7/2014 | |
| JP | 2015-007276 A | | 1/2015 | |
| JP | 2015-193916 A | | 11/2015 | |
| JP | 2016-074963 A | | 5/2016 | |
| JP | 2017-031447 A | | 2/2017 | |
| JP | 2017-179515 A | | 10/2017 | |
| WO | 2017/217387 A1 | | 12/2017 | |
| WO | 2018/142776 A1 | | 8/2018 | |

OTHER PUBLICATIONS

International Search Report dated Jan. 29, 2019, issued for PCT/JP2018/039332 and English translation thereof.
Office Action dated Jul. 23, 2019, issued for the Japanese Patent Application No. 2018-197082 and English translation thereof.
Extended European Search Report issued in corresponding European Patent Application No. EP 18871709.4, dated Jul. 9, 2021.

* cited by examiner

TIN OR TIN ALLOY PLATING SOLUTION

TECHNICAL FIELD

The present invention relates to a plating solution of tin or a tin alloy plating solution for producing a bump serving as a bump electrode of tin or a tin alloy on a substrate in a case of mounting a semiconductor integrated circuit chip on a circuit board. The invention more particularly relates to a tin or tin alloy plating solution having excellent via filling properties for vias on a substrate even in a pattern having different bump diameters, and a uniform height of formed bumps.

Priority is claimed on Japanese Patent Application No. 2017-205203, filed on Oct. 24, 2017 and Japanese Patent Application No. 2018-197082, filed on Oct. 19, 2018, the content of which is incorporated herein by reference.

BACKGROUND ART

In a circuit board on which a semiconductor integrated circuit chip (hereinafter, referred to as a semiconductor chip) is to be mounted, a chip size/scale package (CSP) type semiconductor device having a package substrate area that is reduced to approximately the same size as that of a semiconductor chip to be mounted on the substrate is currently mainly produced, in order to respond to light and thin products. In order to connect the circuit board and the semiconductor chip to each other, a via opening which is a via body on a substrate side is filled with tin or a tin alloy to form a bump which is a bump electrode of a protruding metal terminal, and this bump is s loaded with a semiconductor chip.

In the related art, in a case of forming a bump by the filling of the tin or tin alloy material, the via body is filled with a conductive paste such as a tin-based solder paste or a tin-based solder ball, or a tin-plated deposition layer is formed in the via by an electroplating method using a plating solution of tin or a tin alloy, and then, the conductive paste, the solder ball, or the tin-plated deposition layer is melted by a heat treatment.

Figure 1:
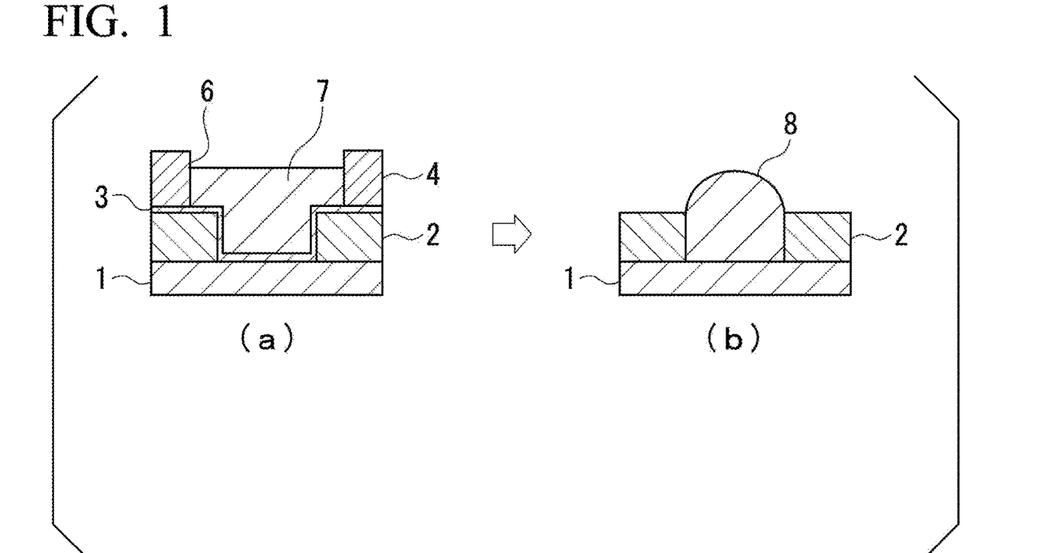
FIG. 1(a) is a cross-sectional configuration diagram in which a plating deposition layer is formed in a via of the invention.
FIG. 1(b) is a cross-section configuration diagram after peeling off a dry film and a copper seed layer and heating the plating deposition layer.

A general method for forming a bump by the electroplating method will be described with reference to FIG. 1. As shown in FIG. 1(a), a solder resist pattern having an opening is formed on a surface of a substrate 1 on which wirings and the like are provided. Next, electroless plating is performed on a surface of the solder resist layer 2 to form a copper seed layer 3 for power supply. Next, a dry film resist layer 4 is formed on a surface of the copper seed layer 3, and a dry film resist pattern having an opening is formed so as to be connected to the opening of the solder resist layer 2. Next, by supplying power through the copper seed layer 3, electric tin plating is performed in a via 6 of the dry film resist pattern, and a tin plating deposition layer 7 (tin plating film) is formed in the via 6 on the copper seed layer 3. Next, after the dry film resist layer and the copper seed layer are sequentially removed, the remaining tin plating deposition layer is melted by a reflow process, and a tin bump 8 is formed as shown in FIG. 1(b).

Previously, in a case of forming a tin or tin alloy bump using the electroplating method, the improvement regarding via filling properties of vias on the substrate or prevention of empty spaces in the bump has been made by changing the content components of the tin or tin alloy plating solution (for example, see PTLs 1, 2, 3, and 4).

PTL 1 discloses a tin or tin alloy plating solution containing a compound of specific $\alpha,\beta$-unsaturated aldehyde or specific $\alpha,\beta$-unsaturated ketone. PTL 1 discloses that this plating solution has a high via-fill effect, and in a case where this plating solution is used, tin plating is selectively deposited in a recessed portion, thereby obtaining a tin plating deposit having substantially no empty spaces, and no burning or abnormal precipitation occurs on the formed tin plating film surface, thereby obtaining a tin plating film having practical and good appearance with excellent solderability or color fastness.

PTL 2 discloses a tin or tin alloy plating solution including (a) a carboxyl group-containing compound, and (b) a carbonyl group-containing compound, in which a content of the component (a) is 1.3 g/L or more, and a content of the component (b) is 0.3 g/L or more. PTL 2 discloses that this plating solution can be filled in a blind via or a through hole with high reliability in a short period of time by electroplating a plating object having a blind via or a through hole, and can be used in three-dimensional mounting of a semiconductor, a filling step in a blind via or a through hole in a printed wiring board, or formation of silicon through electrode.

PTL 3 discloses a tin or tin alloy plating solution containing inorganic acid, organic acid, and a water-soluble salt thereof, a surfactant, and a leveling agent. Here, the surfactant is at least one nonionic surfactant selected from the group consisting of polyoxyalkylene phenyl ether or a salt thereof, and polyoxyalkylene polycyclic phenyl ether or a salt thereof, the phenyl constituting polyoxyalkylene phenyl ether, and polycyclic phenyl constituting the polyoxyalkylene polycyclic phenyl ether may be substituted with an alkyl group having 1 to 24 carbon atoms or a hydroxy group, and the leveling agent may be at least one selected from the group consisting of an aliphatic aldehyde, an aromatic aldehyde, an aliphatic ketone, and an aromatic ketone; and $\alpha,\beta$-unsaturated carboxylic acid or an amide thereof, or a salt thereof. Patent Document 3 includes a specific nonionic surfactant and a specific two types of leveling agents, so that it has excellent recessed portion filling properties and can suppress the generation of empty spaces. It is described that in a case where a plating solution is used, it is possible to provide a good bump which is smooth without a recessed portion and free from empty spaces after reflow.

Further, PTL 4 discloses a tin alloy electroplating solution for forming bump electrodes, containing (A) a soluble salt consisting of any of a stannous salt and a mixture of a stannous salt and a salt of a metal selected from silver, copper, bismuth, nickel, indium, and gold, (B) acid or a salt thereof, and (C) a filling organic compound selected from the group consisting of an aromatic and aliphatic aldehyde, an aromatic and aliphatic ketone, unsaturated carboxylic acids, and aromatic carboxylic acids, and (D) a nonionic surfactant. PTL 4 discloses that, since a combination of the specific compound (C) which prevents the precipitation of a tin-based material and the component (D) is used in this plating solution, it is possible to effectively prevent the precipitation on an upper portion of a via, cause the precipitation of the tin-based material to preferentially proceed towards the upper side of the via from ma bottom portion of the via, and smoothly fill the via while preventing the generation of empty spaces, thereby forming a bump electrode in an excellent manner after reflow or without reflow and obtaining excellent brazing bonding strength electrical properties.

CITATION LIST

Patent Literature

[PTL 1] Japanese Unexamined Patent Application, First Publication No. 2014-125662 (claim 2, paragraph [0020])

[PTL 2] Japanese Unexamined Patent Application, First Publication No. 2015-007276 (claim 1, paragraphs [0011] and [0012])

[PTL 3] Japanese Unexamined Patent Application, First Publication No. 2015-193916 (claim 1, paragraph [0019])

[PTL 4] Japanese Unexamined Patent Application, First Publication No. 2016-074963 (claim 1, paragraph [0019])

DISCLOSURE OF INVENTION

Technical Problem

In recent years, wiring patterns having different bump diameters or bump pitches have been mixed on one circuit board. In such complicated wiring patterns, it is necessary to form all bumps at a uniform height, even in a case where the bump diameters and the bump pitches are different. According to the tin or tin alloy plating solutions of PTLs 1 to 4, the generation of empty spaces in the bumps is prevented, the via on the substrate can be filled with high reliability in a short period of time, and the via filling properties and appearance are excellent. However, the plating solutions for substrates in PTLs do not aim at achieving bump height uniformity.

Figure 2:
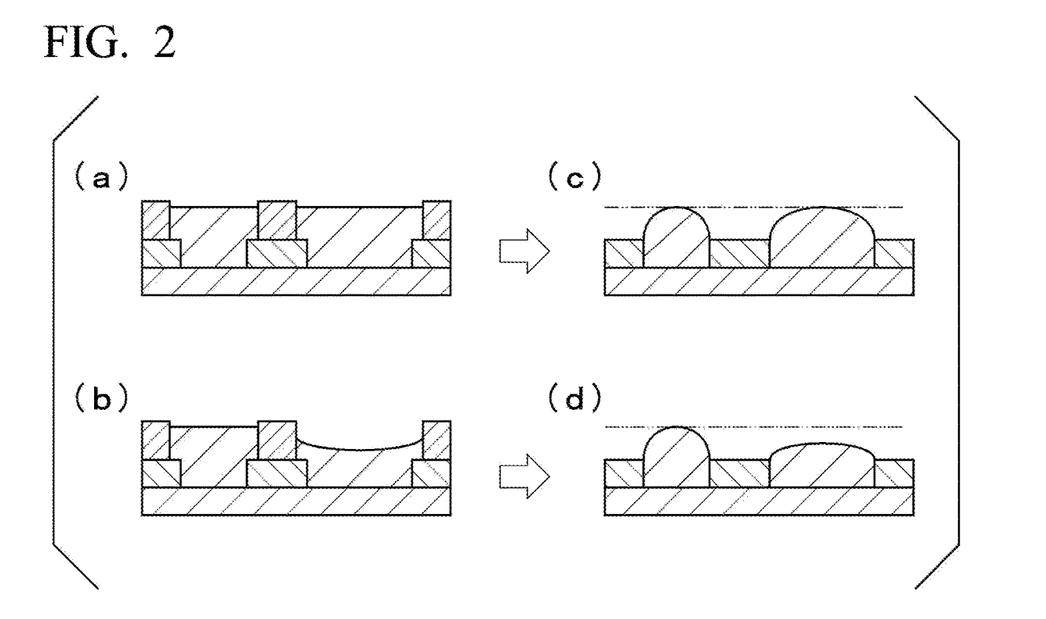
FIG. 2(a) is a cross-sectional configuration diagram showing an example in which a plating deposition layer is formed uniformly in a pattern having different bump diameters (via diameters)
FIG. 2(b) is a cross-sectional configuration diagram showing an example in which a plating deposition layer is formed non-uniformly in a pattern having different bump diameters (via diameters)
FIG. 2(c) is a cross-sectional configuration diagram showing an example in which a height of formed bump becomes uniform, after peeling off a dry film and a copper seed layer and heating the plating deposition layer in FIG. 2(a)
FIG. 2(d) is a cross-sectional configuration diagram showing an example in which the height of formed bump varies, after peeling off a dry film and a copper seed layer and heating the plating deposition layer in FIG. 2(b).

Specifically, as shown in FIG. 2, in the case of a pattern having a different bump diameter, plating with a conventional tin or tin alloy plating solution can improve the via filling properties of either a small diameter or a large diameter is possible, but the other via-filling properties is reduced. That is, in a case of performing the plating on both vias at the same time on a substrate having both vias having a small diameter and a large diameter, it is difficult to perform the plating on both vias with excellent via filling properties. As described above, in a case where vias having different via filling properties are present (FIG. 2(b)), a deviation in height of the bumps after the reflow increases, and it is difficult to achieve bump height uniformity (FIG. 2(d)). Therefore, in order to achieve the bump height uniformity (FIG. 2(c)), as shown in FIG. 2(a), it is necessary to improve via filling properties for both vias having a small diameter and a large diameter.

An object of the invention is to provide a tin or tin alloy plating solution which having excellent via filling properties for vias on a substrate even in a pattern having different bump diameters, and a uniform height of formed bumps.

Solution to Problem

According to a first viewpoint of the present invention, there is provided a tin or tin alloy plating solution including: (A) a soluble salt containing at least a stannous salt; (B) an acid selected from an organic acid and an inorganic acid or a salt thereof; (C) a surfactant; and (D) a leveling agent, in which the surfactant contains a phenyl-based surfactant and the phenyl-based surfactant is a polyoxyethylene bisphenol ether represented by General Formula (1), (1)

Here, in the Formula (1), X is $C_aH_{2a}$ (a is 1 or 3) and m is 2 to 12.

In a second viewpoint of the present invention, there is provided the tin or tin alloy plating solution according to the first viewpoint, further including two or more of a surfactant other than the phenyl-based surfactant, an antioxidant, and an alcohol having 1 to 3 carbon atoms.

According to a third viewpoint of the present invention, there is provided a method for forming a bump by forming a tin or tin alloy plating deposition layer on a substrate using the tin or tin alloy plating solution according to the first or second viewpoint, and then by performing a reflow process.

According to a fourth viewpoint of the invention, there is provided a method for producing a circuit board using a bump formed by the method according to the third viewpoint.

Advantageous Effects of Invention

In the tin or tin alloy plating solution of the first viewpoint of the invention, the phenyl-based surfactant has a specific phenyl structure in which a of X and in of the polyoxyethylene group in General Formula (1) are respectively in predetermined ranges, and accordingly, it is possible to perform the plating on a surface to be plated by preventing the precipitation of Sn ions during plating. In particular, according to this plating solution, in the case of a pattern having different bump diameters, polarization resistance is great, even in a case where the bump diameter is large or small, and accordingly, the via filling properties for vias on a substrate are excellent, and a height of formed bumps become uniform.

The tin or tin alloy plating solution according to the second viewpoint of the invention further includes two or more of a surfactant other than the phenyl-based surfactant, an antioxidant, and an alcohol having 1 to 3 carbon atoms, and accordingly the following effects are exhibited. The surfactant other than the phenyl-based surfactant exhibits effects such as stabilization of the plating solution, improvement of solubility, and the like. In addition, the antioxidant prevents the oxidation of a soluble stannous salt to a tin dioxide salt. Further, the alcohol exhibits an effect of improving solubility of the surfactant.

In the method for forming a bump according to the third viewpoint of the invention, a bump is formed by forming a tin or tin plating deposition layer on a substrate using the tin or tin alloy plating solution, and then by performing a reflow process, and accordingly, it is possible to form bumps having a uniform height, even with a pattern having different bump diameters.

In the method for producing a circuit board according to the fourth viewpoint of the invention, a circuit board is produced using a bump formed by the method according to the third viewpoint, and accordingly, it is possible to produce a semiconductor device having high reliability without electrical connection failure.

BEST MODE FOR CARRYING OUT THE INVENTION

Next, an embodiment for carrying out the invention will be described.

The tin or tin alloy plating solution of the invention includes (A) a soluble salt containing at least a stannous salt, (B) an acid selected from an organic acid and an inorganic acid or a salt thereof, (C) a surfactant, and (D) a leveling agent. This surfactant contains a phenyl-based surfactant, and the phenyl-based surfactant is polyoxyethylene bisphenol ether represented by the General Formula (1).

The soluble salt consists of any of a stannous salt and a mixture of a stannous salt and a salt of a metal selected from silver, copper, bismuth, nickel, antimony, indium, and zinc.

The tin alloy of the invention is an alloy of tin and a predetermined metal selected from silver, copper, bismuth, nickel, antimony, indium, and zinc, and examples thereof include a tin-silver alloy, a tin-copper alloy, a tin-bismuth alloy, a tin-nickel alloy, a tin-antimony alloy, a tin-indium alloy, a binary alloy of a tin-zinc alloy, and a ternary alloy such as a tin-copper-bismuth alloy or tin-copper-silver alloy.

Therefore, the soluble salt (A) of the invention means any soluble salt that generates various metal ions such as $Sn^{2+}$, $Ag^+$, $Cu^+$, $Cu^{2+}$, $Bi^{3+}$, $Ni^{2+}$, $Sb^{3+}$, $In^{3+}$, and $Zn^{2+}$ in the plating solution, and examples thereof include an oxide and a halide of the metal, and the metal salt of inorganic acid or organic acid.

Examples of metal oxide include a stannous oxide, a copper oxide, a nickel oxide, a bismuth oxide, an antimony oxide, an indium oxide, and a zinc oxide. Examples of the halide of metal include a stannous chloride, a bismuth chloride, a bismuth bromide, a cuprous chloride, a cupric chloride, a nickel chloride, an antimony chloride, an indium chloride, and a zinc chloride.

Examples of the metal salt of inorganic acid or organic acid include copper sulfate, stannous sulfate, bismuth sulfate, nickel sulfate, antimony sulfate, bismuth nitrate, silver nitrate, a copper nitrate, antimony nitrate, indium nitrate, nickel nitrate, zinc nitrate, copper acetate, nickel acetate, nickel carbonate, sodium stannate, stannous borofluoride, stannous methanesulfonate, silver methanesulfonate, copper methanesulfonate, bismuth methanesulfonate, nickel methanesulfonate, indium methanesulfonate, zinc bismethanesulfonate, stannous ethanesulfonate, and bismuth 2-hydroxypropanesulfonate.

The acid or a salt thereof (B) of the invention is selected from an organic acid, an inorganic acid, or a salt thereof. Examples of the organic acid include organic sulfonic acid such as alkanesulfonic acid, alkanolsulfonic acid, and aromatic sulfonic acid, and aliphatic carboxylic acid. Examples of the inorganic acid include borofluoric acid, hydrofluorosilicic acid, sulfamine acid, hydrochloric acid, sulfuric acid, nitric acid, and perchloric acid. Examples of the salt thereof include a salt of alkali metal, a salt of alkaline earth metal, an ammonium salt, an amine salt, and a sulfonate. The component (B) is preferably organic sulfonic acid from a viewpoint of solubility of the metal salt or ease of wastewater treatment.

As the alkanesulfonic acid, a material represented by a chemical formula $C_nH_{2n+1}SO_3H$ (for example, n=1 to 5, preferably 1 to 3) can be used, and specific examples thereof include methanesulfonic acid, ethanesulfonic acid, 1-propanesulfonic acid, 2-propanesulfonic acid, 1-butanesulfonic acid, 2-butanesulfonic acid, pentanesulfonic acid, hexanesulfonic acid, decanesulfonic acid, and dodecanesulfonic acid.

As the alkanolsulfonic acid, a material represented by a chemical formula $C_pH_{2p+1}-CH(OH)-C_qH_{2q}-SO_3H$ (for example, p=0 to 6, q=1 to 5) can be used, and specific examples thereof include 2-hydroxyethane-1-sulfonic acid, 2-hydroxypropane-1-sulfonic acid, 2-hydroxybutane-1-sulfonic acid, 2-hydroxypentane-1-sulfonic acid, 1-hydroxypropane-2-sulfonic acid, 3-hydroxypropane-1-sulfonic acid, 4-hydroxybutane-1-sulfonic acid, 2-hydroxyhexane-1-sulfonic acid, 2-hydroxydecane-1-sulfonic acid, and 2-hydroxydodecane-1-sulfonic acid.

The aromatic sulfonic acid is basically benzene sulfonic acid, alkyl benzene sulfonic acid, phenol sulfonic acid, naphthalene sulfonic acid, or alkyl naphthalene sulfonic acid, and specific examples thereof include 1-naphthalene sulfonic acid, 2-naphthalene sulfonic acid, toluenesulfonic acid, xylenesulfonic acid, p-phenolsulfonic acid, cresolsulfonic acid, sulfosalicylic acid, nitrobenzenesulfonic acid, sulfobenzoic acid, and diphenylamine-4-sulfonic acid.

Examples of the aliphatic carboxylic acid include acetic acid, propionic acid, butyric acid, citric acid, tartaric acid, gluconic acid, sulfosuccinic acid, and trifluoroacetic acid.

The phenyl-based surfactant contained in the surfactant of the invention is polyoxyethylene bisphenol ether represented by General Formula (1).

(1)

Here, in the Formula (1), X is $C_aH_{2a}$ (a is 1 or 3) and m is 2 to 12. Here, in a case where m is less than 2, it is difficult to dissolve in the plating solution or abnormal appearance of the plating may occur, and in a case where it exceeds 12, via filling properties may be deteriorated or abnormal appearance of the plating may occur. m is preferably 5 to 10. The polyoxyethylene bisphenol ether represented by General Formula (1) may contain ortho, meta, and para isomers, and a mixture thereof.

The leveling agent (D) of the invention is added to form a uniform and dense plating film and to smooth the plating film. In order to improve the via filling properties and prevent the generation of empty spaces, two types of a first leveling agent (D-1) and a second leveling agent (D-2) are used. Examples of the first leveling agent (D-1) include one or two or more selected from the group consisting of aliphatic aldehyde, aromatic aldehyde, aliphatic ketone, and aromatic ketone, and examples of the second leveling agent (D-2) include α,β-unsaturated carboxylic acid or amide thereof, and salt thereof.

The first leveling agent (D-1) is a carbonyl compound containing aldehyde or ketone, and does not include α,β-unsaturated carboxylic acid of the second leveling agent (D-2). Specific examples are as follows. Examples of the aliphatic aldehyde include formaldehyde, acetaldehyde, and allyl aldehyde. Examples of the aromatic aldehyde include benzaldehyde, 2-chlorobenzaldehyde, 3-chlorobenzaldehyde, 4-chlorobenzaldehyde, 2,4-dichlorobenzaldehyde, 2,6-dichlorobenzaldehyde, 2,4,6-trichlorobenzaldehyde, 1-naphthaldehyde, 2-naphthaldehyde, 2-hydroxybenzaldehyde, 3-hydroxybenzaldehyde, 4-hydroxybenzaldehyde, 2-methylbenzaldehyde, 3-methylbenzaldehyde, 4-methylbenzaldehyde, m-anisaldehyde, o-anisaldehyde, and p-anisaldehyde. In addition, examples of the aliphatic ketone include acetylacetone. Further, examples of the aromatic ketone include benzylideneacetone (synonymous with benzalacetone), 2-chloroacetophenone, 3-chloroacetophenone, 4-chloroacetophenone, 2,4-dichloroacetophenone, and 2,4,6-trichloroacetophenone. These may be used alone or in combination of two or more types thereof. A preferred content of the first leveling agent (D-1) in an electroplating bath (an amount of a single substance, in a case where it is used alone, and a total amount of substances, in a case where two or more types are included) is 0.001 g/L to 0.3 g/L and more preferably 0.01 g/L to 0.25 g/L. In a case where the content of the component is small, the effect of adding the component is not sufficient, and on the other hand, in a case where the content of the component is excessively large, the smoothing of the plating film may be inhibited.

Examples of the second leveling agent (D-2) include acrylic acid, methacrylic acid, picolinic acid, crotonic acid, 3-chloroacrylic acid, 3,3-dimethylacrylic acid, 2,3-dimethylacrylic acid, methyl acrylate, ethyl acrylate, n-butyl acrylate, isobutyl acrylate, 2-ethylhexyl acrylate, ethyl methacrylate, n-butyl methacrylate, isobutyl methacrylate, 2-hydroxyethyl methacrylate, 2-hydroxypropyl methacrylate, 2-dimethylaminoethyl methacrylate, methacrylic anhydride, and methyl methacrylic acid. In addition, the second leveling agent (D-2) also includes amide of $\alpha,\beta$-unsaturated carboxylic acid (for example, acrylamide or the like) and a salt of $\alpha,\beta$-unsaturated carboxylic acid (for example, potassium, sodium, or ammonium). A preferred content of the second leveling agent (D-2) in an electroplating bath (an amount of a single substance, in a case where it is used alone, and a total amount of substances, in a case where two or more types are included) is 0.01 g/L to 50 g/L, more preferably 0.05 g/L to 30 g/L, and even more preferably 0.05 g/L to 10 g/L. In a case where the content of the component is small, the effect of adding the component is not sufficient, and on the other hand, in a case where the content of the component is excessively large, the smoothing of the plating film may be inhibited.

The tin or tin alloy plating solution of the invention preferably further includes two or more of a surfactant (E) other than the phenyl-based surfactant, an antioxidant (F), and alcohol (G) having 1 to 3 carbon atoms.

In this case, examples of the other surfactant (E) include an ordinary anionic surfactant, a cationic surfactant, a nonionic surfactant, and an amphoteric surfactant.

Examples of the anionic surfactant include polyoxyalkylene alkyl ether sulfate such as sodium polyoxyethylene (ethylene oxide: containing 12 mol) nonyl ether sulfate, polyoxyalkylene alkyl phenyl ether sulfate such as sodium polyoxyethylene (ethylene oxide: containing 12 mol) dodecylphenyl ether sulfate, alkyl benzene sulfonate such as sodium dodecylbenzene sulfonate, naphthol sulfonate such as sodium 1-naphthol-4-sulfonate or disodium 2-naphthol-3,6-disulfonate, (poly)alkylnaphthalenesulfonate such as sodium diisopropylnaphthalenesulfonate or sodium dibutylnaphthalenesulfonate, and alkyl sulfate such as sodium dodecyl sulfate or sodium oleyl sulfate.

Examples of cationic surfactant include mono-trialkylamine salt, dimethyldialkylammonium salt, trimethylalkylammonium salt, dodecyltrimethylammonium salt, hexadecyltrimethylammonium salt, octadecyltrimethylammonium salt, dodecyldimethylammonium salt, octadecenyl dimethylethylammonium salt, dodecyldimethylbenzylammonium salt, hexadecyldimethylbenzylammonium salt, octadecyldimethylbenzylammonium salt, trimethylbenzylammonium salt, triethylbenzylammonium salt, hexadecylpyridinium salt, dodecylpyridinium salt, dodecylpicolinium salt, dodecylimidazo linium salt, oleyl imidazolinium salt, octadecylamine acetate, and dodecylamine acetate.

Examples of the nonionic surfactant include a material obtained by adding and condensing 2 to 300 mol of ethylene oxide (EO) and/or propylene oxide (PO) to sugar ester, fatty acid ester, $C_1$ to $C_{25}$ alkoxyl phosphoric acid (salt), sorbitan ester, and $C_1$ to $C_{22}$ aliphatic amide, and sulfated or sulfonated adducts of the condensation products of silicon-based polyoxyethylene ether, silicon-based polyoxyethylene ester, fluorine-based polyoxyethylene ether, fluorine-based polyoxyethylene ester, ethylene oxide and/or propylene oxide and alkylamine or diamine.

Examples of the amphoteric surfactant include betaine, carboxybetaine, imidazolinium betaine, and sulfobetaine, aminocarboxylic acid.

The antioxidant (F) is used for preventing the oxidation of the soluble stannous salt to the tin dioxide salt. Examples of antioxidant include hypophosphorous acids, ascorbic acid or a salt thereof, phenolsulfonic acid (Na), cresolsulfonic acid (Na), hydroquinonesulfonic acid (Na), hydroquinone, $\alpha$- or $\beta$-naphthol, catechol, resorcin, phloroglucin, hydrazine, phenolsulfonic acid, catecholsulfonic acid, hydroxybenzenesulfonic acid, naphtholsulfonic acid, and salts thereof.

The alcohol (G) having 1 to 3 carbon atoms is used for improving the solubility of the surfactant. Examples of the alcohol include methanol, ethanol, 1-propanol, and 2-propanol. The alcohol can be used alone or in combination of two or more kinds thereof.

A content of the phenyl-based surfactant (C) in the plating solution is 0.5 g/L to 50 g/L and preferably 1 g/L to 5 g/L. In a case where the content is less than the lower limit, plating failure such as a dendrite occurs due to an excessive supply of Sn ions. On the other hand, in a case where the value exceeds the upper limit, Sn ions hardly reach the surface to be plated, and the via-filling properties is deteriorated (decreased).

The predetermined soluble metal salt (A) can be used alone or in combination, and a content thereof in the plating solution is 30 g/L to 100 g/L and preferably 40 g/L to 60 g/L. In a case where the content is less than the appropriate range, the productivity is reduced, and in a case where the content increases, the cost of the plating solution increases.

The organic acid and inorganic acid or a salt thereof (B) can be used alone or in combination, and a content thereof in the plating solution is 80 g/L to 300 g/L and preferably from 100 g/L to 200 g/L. In a case where the content is less than the appropriate range, electrical conductivity is low and a voltage increases, and in a case where the content increases, viscosity of the plating solution increases and a stirring speed of the plating solution decreases.

Meanwhile, a temperature of the electroplating solution of the invention is generally 70° C. or lower and preferably 10° C. to 40° C. A current density during the formation of a plating film by electroplating is in a range of 0.1 A/dm² to 100 A/dm² and preferably in the range of 0.5 A/dm² to 20 A/dm². In a case where the current density is excessively low, the productivity deteriorates, and in a case where the current density is excessively high, the height uniformity of the bumps deteriorates.

By applying the plating solution of the tin or tin alloy containing the phenyl-based surfactant (C) of the invention to a circuit board which is a material to be plated, a predetermined metal film can be formed on the circuit board. Examples of the circuit board include a printed circuit board, a flexible printed circuit board, and a semiconductor integrated circuit board.

EXAMPLES

Next, examples of the invention will be described in detail together with comparative examples.

Phenyl-Based Surfactant (C) Used in Examples and Comparative Examples

Tables 1 and 2 show each structural formula of polyoxyethylene bisphenol ether which is the phenyl-based surfactant (C) used in Examples 1 to 7 and Comparative Examples 1 and 2.

TABLE 1

| Compound of phenyl-based surfactant | Structural formula of compound of phenyl-based surfactant |
| --- | --- |
| c-1 (a = 1) (m = 5) | H—(O—CH$_2$—CH$_2$)$_5$—O—[phenyl]—X—[phenyl]—O—(CH$_2$—CH$_2$—O)$_5$—H |
| c-2 (a = 1) (m = 10) | H—(O—CH$_2$—CH$_2$)$_{10}$—O—[phenyl]—X—[phenyl]—O—(CH$_2$—CH$_2$—O)$_{10}$—H |
| c-3 (a = 3) (m = 2) | H—(O—CH$_2$—CH$_2$)$_2$—O—[phenyl]—X—[phenyl]—O—(CH$_2$—(CH$_2$—O)$_2$—H |
| c-4 (a = 3) (m = 3) | H—(O—CH$_2$—CH$_2$)$_3$—O—[phenyl]—X—[phenyl]—O—(CH$_2$—CH$_2$—O)$_3$—H |
| c-5 (a = 3) (m = 5) | H—(O—CH$_2$—CH$_2$)$_5$—O—[phenyl]—X—[phenyl]—O—(CH$_2$—CH$_2$—O)$_5$—H |
| c-6 (a = 3) (m = 9) | H—(O—CH$_2$—CH$_2$)$_9$—O—[phenyl]—X—[phenyl]—O—(CH$_2$—CH$_2$—O)$_9$—H |
| c-7 (a = 3) (m = 10) | H—(O—CH$_2$—CH$_2$)$_{10}$—O—[phenyl]—X—[phenyl]—O—(CH$_2$—CH$_2$—O)$_{10}$—H |
| c-8 (a = 3) (m = 12) | H—(O—CH$_2$—CH$_2$)$_{12}$—O—[phenyl]—X—[phenyl]—O—(CH$_2$—CH$_2$—O)$_{12}$—H |

TABLE 2

| Compound of phenyl-based surfactant | Structural formula of compound of phenyl-based surfactant |
|---|---|
| c-9 ($a = 3$) ($m = 1$) |  H—(O—CH$_2$—CH$_2$)$_1$—O—⟨⟩—X—⟨⟩—O—(CH$_2$—CH$_2$—O)$_1$—H |
| c-10 ($a = 3$) ($m = 15$) |  H—(O—CH$_2$—CH$_2$)$_{15}$—O—⟨⟩—X—⟨⟩—O—(CH$_2$—CH$_2$—O)$_{15}$—H |

Example 1

Preparation of Sn Plating Solution

Methanesulfonic acid as a free acid, hydroquinone as an antioxidant, 1-naphthaldehyde as a first leveling agent, and methacrylic acid as a second leveling agent were mixed with a Sn methanesulfonate aqueous solution to form a uniform solution, and then, the polyoxyethylene bisphenol ether (mass average molecular weight: approximately 600 g/mol) of the (C-1) was further added thereto as a surfactant. Ion-exchanged water was finally added to prepare a Sn plating solution having the following composition. The Sn methanesulfonate aqueous solution was prepared by electrolyzing a metal Sn plate in a methanesulfonic acid aqueous solution.

Composition of Sn Plating Solution

Sn methanesulfonate (as $Sn^{2+}$): 50 g/L
Potassium methanesulfonate (as free acid): 100 g/L
Phenyl-based surfactant (C-1): 2 g/L
Hydroquinone (as the antioxidant (F)): 1 g/L
1-naphthaldehyde (as the first leveling agent (D-1)): 0.1 g/L
Methacrylic acid (as the second leveling agent (D-2)): 2 g/L
Ion-exchanged water: balance

Examples 2 to 8 and Comparative Examples 1 and 2

In Examples 2 to 8 and Comparative Examples 1 and 2, polyoxyethylene bisphenol ether ((C-2) to (C-10)) of the structural formulae shown in Tables 1 and 2 were used as the phenyl-based surfactant (C). Except this, Sn plating solutions of Examples 2 to 8 and Comparative Examples 1 and 2 were prepared in the same manner as in Example 1. In Example 3 and Comparative Example 2, Ag was included as metal other than Sn (1.0 g/L as Ag+), and in Example 5, Cu was included as metal other than Sn (0.5 g/L as Cu2+).

Comparative Test and Evaluation

The plating was performed on a substrate having a pattern having different bump diameters using the 10 types of the prepared plating solutions of Examples 1 to 8 and Comparative Examples 1 and 2 under the condition of a current density of 2ASD, and tin or tin alloy plating deposition layers were formed in vias. It was heated to 280° C. using a reflow apparatus, the plating deposition layer was dissolved, and a bump was formed. These plating deposition layers and bumps were evaluated.

"Via filling properties of the tin or tin alloy plating deposition layer in the via" and "appearance of the tin or tin alloy plating deposition layer in the via" which will be described later are measured regarding the plating deposition layer before the reflow, and "deviation in bump height" and "ease of generation of empty spaces" are measured regarding the bump formed after the reflow of the plating deposition layer. The results thereof are shown in Table 3.

(1) Via Filling Properties of Tin or Tin Alloy Plating Deposition Layer in Via

The tin or tin alloy plating deposition layer in the via was observed with a laser microscope, and a difference in height between the highest point and the lowest point of the plating deposition layer was measured. A case where the difference in height exceeded 5 μm was determined as "poor", a case where the difference in height was 5 μm or less was determined as "excellent", and these were shown in the column of "via filling properties" of Table 3.

(2) Appearance of Plating Deposition Layer

The tin or tin alloy plating deposition layer in the via was observed with a laser microscope, and a surface roughness Ra was measured. A case where the surface roughness Ra of the plating deposition layer exceeded 2 μm was determined as "poor", a case where the surface roughness Ra was 2 μm or less was judged as "excellent", and these were shown in the column of "appearance of plating deposition layer" of Table 3.

(3) Deviation in Bump Height

The height of the bump on the substrate was measured using an automatic appearance inspection device. A height deviation σ (standard deviation) was calculated from the measured bump heights. A case where the height deviation σ is 3 or less was determined as "uniform", and a case where the height deviation σ exceeded 3 was determined as "non-uniform", and the result thereof were shown in the column of "bump height deviation σ" of Table 3.

(4) Ease of Generation of Empty Spaces

Transmission X-ray images were captured for bumps (2,000 in total) arranged at pitch intervals of 180 μm, 250 μm, and 360 μm and having diameters of 70 μm, 90 μm, and 120 μm. The captured image was visually observed. A case where one or more empty spaces having a size of 1% or more with respect to the size of the bump was observed was determined as "NG", and a case where no empty spaces were observed was determined as "OK". The results thereof were shown in the column of "empty spaces" of Table 3.

TABLE 3

| | Phenyl-based surfactant | | | Evaluation | | | |
|---|---|---|---|---|---|---|---|
| | Compound No. | Mass average molecular weight | Metal other than Sn | Via filling properties | Appearance of plating deposition layer | Bump height deviation σ | Empty spaces |
| Example 1 | C-1 | 600 | — | Excellent | Excellent | Uniform | OK |
| Example 2 | C-2 | 1050 | — | Excellent | Excellent | Uniform | OK |
| Example 3 | C-3 | 400 | Ag | Excellent | Excellent | Uniform | OK |
| Example 4 | C-4 | 500 | — | Excellent | Excellent | Uniform | OK |
| Example 5 | C-5 | 650 | Cu | Excellent | Excellent | Uniform | OK |
| Example 6 | C-6 | 1000 | — | Excellent | Excellent | Uniform | OK |
| Example 7 | C-7 | 1100 | — | Excellent | Excellent | Uniform | OK |
| Example 8 | C-8 | 1300 | — | Excellent | Excellent | Uniform | OK |
| Comparative Example 1 | C-9 | 300 | — | Excellent | Poor | Non-uniform | OK |
| Comparative Example 2 | C-10 | 1550 | Ag | Poor | Poor | Non-uniform | OK |

As clearly shown in Table 3, in Comparative Example 1 in which the compound No. C-9 was used as the phenyl-based surfactant, m in General Formula (1) was excessively small as 1. Accordingly, although via filling properties were excellent and the ease of generation of empty spaces was OK due to no empty spaces observed in the bump, the appearance of the plating deposition layer was poor and the bump height deviation was not uniform. In addition, in Comparative Example 2 in which the compound No. C-10 was used as the phenyl-based surfactant, m in General Formula (1) was excessively large as 15. Accordingly, although the ease of generation of empty spaces was OK due to no empty spaces observed in the bump, the via filling properties and the appearance of the plating deposition layer were poor and the bump height deviation was not uniform.

In contrast, in Examples 1 to 8 in which the compounds No. C-1 to C-8 were used as the phenyl-based surfactant, m in General Formula (1) was in an appropriate range of 2 to 12 (2 to 12), the via filling properties and the appearance of the plating deposition layer were excellent, the bump height deviation was entirely uniform, and the ease of generation of empty spaces was OK due to no empty spaces observed in the bump.

Examples 9 to 18

In Examples 9 to 18, a Sn plating solution was prepared in the same manner as in Example 1, except that any of the first leveling agent (D-1), the second leveling agent (D-2), or the metal other than Sn, and the mass average molecular weight of the phenyl-based surfactant were changed as shown in Table 4. In the first leveling agent (D-1) of Table 4, D1A is benzaldehyde, D1B is 4-chlorobenzaldehyde, and D1C is 1-naphthaldehyde. In addition, in the second leveling agent (D-2) of Table 4, D2A is methacrylic acid, D2B is acrylic acid, and D2C is acrylamide.

Comparative Test 2 and Evaluation

The plating was performed on a substrate having a pattern having different bump diameters using the 10 types of the prepared plating solutions of Examples 9 to 18 under the condition of a current density of 2ASD in the same manner as in the comparative test 1, and tin or tin alloy plating deposition layers were formed in vias. It was heated to 280° C. using a reflow apparatus, the plating deposition layer was dissolved to form a bump, and the "via filling properties of the tin or tin alloy plating deposition layer in the via", the "appearance of the tin or tin alloy plating deposition layer in the via", the "deviation in bump height", and "ease of generation of empty spaces" were evaluated. Table 4 shows the results thereof.

TABLE 4

| | First leveling agent (D-1) | | Second leveling agent (D-2) | | Amine-based surfactant | | | Evaluation | | | |
|---|---|---|---|---|---|---|---|---|---|---|---|
| | Type | Concentration (g/L) | Type | Concentration (g/L) | Compound No. | Mass average molecular weight | Metal other than Sn | Via filling properties | Appearance of plating deposition layer | Bump height deviation σ | Ease of generation of empty spaces |
| Example 9 | D1A | 0.1 | D2A | 2 | C-1 | 1300 | — | Excellent | Excellent | Uniform | OK |
| Example 10 | D1B | 0.1 | D2A | 2 | C-1 | 1300 | — | Excellent | Excellent | Uniform | OK |
| Example 11 | D1C | 0.1 | D2B | 7 | C-1 | 1300 | — | Excellent | Excellent | Uniform | OK |
| Example 12 | D1C | 0.1 | D2C | 2 | C-1 | 1300 | — | Excellent | Excellent | Uniform | OK |
| Example 13 | D1A | 0.1 | D2A | 2 | C-1 | 1300 | Cu | Excellent | Excellent | Uniform | OK |
| Example 14 | D1C | 0.1 | D2C | 7 | C-1 | 1300 | Ag | Excellent | Excellent | Uniform | OK |
| Example 15 | D1C | 0.001 | D2A | 2 | C-1 | 1300 | — | Excellent | Excellent | Uniform | OK |
| Example 16 | D1C | 0.3 | D2A | 2 | C-1 | 1300 | — | Excellent | Excellent | Uniform | OK |
| Example 17 | D1C | 0.1 | D2A | 0.05 | C-1 | 1300 | — | Excellent | Excellent | Uniform | OK |
| Example 18 | D1C | 0.1 | D2A | 30 | C-1 | 1300 | — | Excellent | Excellent | Uniform | OK |

As clearly shown from Table 4, in Examples 9 to 12 in which the first leveling agent (D-1) was changed to any of benzaldehyde, 4-chlorobenzaldehyde, or 1-naphthaldehyde, and the second leveling agent (D-2) was changed to any of methacrylic acid or acrylic acid, the via filling properties and the appearance of the plating deposition layer were both excellent, the bump height deviation was uniform, and ease of generation of empty spaces was OK due to no empty spaces observed in the bump.

In addition, in Examples 13 and 14 in which the first leveling agent (D-1) was changed to benzaldehyde or 1-naphthaldehyde, the second leveling agent (D-2) was changed to methacrylic acid or acrylamide, and Cu or Ag was added as the metal other than Sn, the via filling properties and the appearance of the plating deposition layer were both excellent, the bump height deviation was uniform, and ease of generation of empty spaces was OK due to no empty spaces observed in the bump.

Further, in Examples 15 and 16 in which the concentration of the first leveling agent (D-1) was changed to 0.001 g/L and 0.3 g/L, respectively, and in Examples 17 and 18 in which the concentration of the second leveling agent (D-2) was changed to 0.05 g/L and 30 g/L, respectively, the via filling properties and the appearance of the plating deposition layer were both excellent, the bump height deviation was uniform, and ease of generation of empty spaces was OK due to no empty spaces observed in the bump.

INDUSTRIAL APPLICABILITY

The tin or tin alloy plating solution of the invention can be used for a circuit board such as a printed circuit board, a flexible printed circuit board, and a semiconductor integrated circuit.

REFERENCE SIGNS LIST

1: Substrate
2: Solder resist layer
3: Copper seed layer
4: Dry film resist layer
6: Via
7: Tin plating deposition layer (tin plating film)
8: Tin bump

The invention claimed is:

1. A method of forming a tin or tin alloy plating deposition layer comprising:
a step of forming the tin or tin alloy plating deposition layer on a substrate with vias having different via diameters by using a tin or tin alloy plating solution and applying a single current density to produce the tin or tin alloy deposition layer comprising a pattern having bumps with different bump diameters and a uniform height of the formed bumps,
wherein the tin or tin alloy plating solution consists of:
a soluble salt consisting of a stannous salt or a mixture of a stannous salt and a salt of a metal selected from copper, bismuth, nickel, antimony, indium, and zinc;
an acid selected from an organic acid and an inorganic acid or a salt thereof;
a surfactant;
a leveling agent; and
ion exchange water,
wherein the surfactant contains a phenyl-based surfactant and the phenyl-based surfactant is a polyoxyethylene bisphenol ether represented by General Formula (1), in the Formula (1), X is $C_aH_{2a}$ (a is 1 or 3) and m is a value selected from 9 to 10,
the polyoxyethylene bisphenol ether has a mass average molecular weight of 1000 to 1100,
the leveling agent is made of a first leveling agent and a second leveling agent
the first leveling agent is one or more selected from a group consisting of aliphatic aldehyde, aromatic aldehyde, aliphatic ketone and aromatic ketone, and
the second leveling agent is α,β-unsaturated carboxylic acid or α,β-unsaturated carboxylic acid amide, or a salt thereof.

2. A method for forming a bump comprising the step of performing a reflow process on the tin or tin alloy plating deposition layer formed by the method of forming a tin or tin alloy plating deposition layer according to claim 1.

3. A method for producing a circuit board using a bump formed by the method according to claim 2.

4. A method of forming a tin or tin alloy plating deposition layer comprising:
a step of forming the tin or tin alloy plating deposition layer on a substrate with vias having different via diameters by using a tin or tin alloy plating solution and applying a single current density to produce the tin or tin alloy deposition layer comprising a pattern having bumps with different bump diameters and a uniform height of the formed bumps,
wherein the tin or tin alloy plating solution consists of:
a soluble salt consisting of a stannous salt or a mixture of a stannous salt and a salt of a metal selected from copper, bismuth, nickel, antimony, indium, and zinc;
an acid selected from an organic acid and an inorganic acid or a salt thereof;
a surfactant containing a phenyl-based surfactant;
a leveling agent;
ion exchange water; and
two or more of: a surfactant other than the phenyl-based surfactant; an antioxidant; and
an alcohol having 1 to 3 carbon atoms,
wherein
the phenyl-based surfactant is a polyoxyethylene bisphenol ether represented by General Formula (1), in the Formula (1), X is $C_aH_2a$ (a is 1 or 3) and m is a value selected from 9 to 10,
the polyoxyethylene bisphenol ether has a mass average molecular weight of 1000 to 1100,
the leveling agent is made of a first leveling agent and a second leveling agent
the first leveling agent is one or more selected from a group consisting of aliphatic aldehyde, aromatic aldehyde, aliphatic ketone and aromatic ketone, and the second leveling agent is α,β-unsaturated carboxylic acid or α,β-unsaturated carboxylic acid amide, or a salt thereof.

5. A method for forming a bump comprising the step of performing a reflow process on the tin or tin alloy plating deposition layer formed by the method of forming a tin or tin alloy plating deposition layer according to claim 4.

* * * * *